United States Patent [19]

Walsh

[11] Patent Number: 5,095,216

[45] Date of Patent: Mar. 10, 1992

[54] METHOD OF FABRICATING INFRARED DETECTORS AND THE DETECTOR

[75] Inventor: Shawn T. Walsh, Garland, Tex.

[73] Assignee: Texas Instruments Incorporated, Dallas, Tex.

[21] Appl. No.: 586,930

[22] Filed: Sep. 24, 1990

[51] Int. Cl.⁵ .............................................. G01J 5/20
[52] U.S. Cl. .................................. 250/338.4; 250/332; 250/370.08; 250/370.13
[58] Field of Search ........... 250/338.4, 370.13, 370.08, 250/370.01, 332

[56] References Cited

U.S. PATENT DOCUMENTS

| | | | |
|---|---|---|---|
| 4,439,912 | 4/1984 | Pollard et al. | 250/370.13 |
| 4,447,291 | 5/1984 | Schulte | 156/643 |
| 4,566,024 | 1/1986 | Fleury et al. | 250/370.08 |
| 4,720,738 | 1/1988 | Simmons | 357/30 |
| 4,929,913 | 5/1990 | Sato | 330/308 |

Primary Examiner—Carolyn E. Fields
Assistant Examiner—James E. Beyer
Attorney, Agent, or Firm—Richard A. Stoltz; Rene E. Grossman; Richard L. Donaldson

[57] ABSTRACT

A method of fabricating an infrared detector and the detector comprising providing a semiconductor layer of group II-VI material, providing an electrically insulating layer having vias therethrough at predetermined locations and having a coefficient of thermal expansion which substantially tracks the coefficient of thermal expansion of said layer, securing the semiconductor layer to the insulating layer, forming infrared detector elements on the semiconductor layer and vias through the semiconductor layer aligned with the vias through the insulating layer, securing the combined semiconductor and insulating layers to the surface of a signal processing semiconductor chip and forming electrical interconnects between the detector elements and the chip through the vias. Also, there is provided an attaching agent securing the chip to the insulating layer, the attaching agent being sufficiently strong to retain the attachment during thermal cycling during processing and receiving thermally caused stresses between the chip and the detector elements.

16 Claims, 2 Drawing Sheets

METHOD OF FABRICATING INFRARED DETECTORS AND THE DETECTOR

BACKGROUND OF THE INVENTION

1. Field of the Invention

This invention relates to a method of fabricating infrared detectors and the detector.

2. Brief Description of the Prior Art

Infrared detectors using HgCdTe area arrays generally utilize HgCdTe photodiodes as optical detectors with the photodiodes being interconnected with silicon processing stages. Such infrared detectors are generally fabricated at temperatures greater than room temperatures but are operated at cryogenic temperatures in the range of liquid nitrogen or liquid helium.

Infrared detectors of the prior art are exemplified by Simmons U.S. Pat. No. 4,720,738 and Schulte U.S. Pat. No. 4,447,291, the specifications of which are incorporated herein by reference, wherein vertically integrated infrared detector semiconductor elements are directly coupled to an underlying silicon signal processing chip and rest on the surface of the underlying chip. This arrangement presents several problems. For example, the surface roughness caused by the non-planar surface topology of the fabricated silicon signal processing chip induces crystal defects in the infrared detector semiconductor when the detector and processing chip are pressed together during the attachment step of the fabrication process. This leads to a yield diminution. Also, the silicon signal processing chip and the infrared detector semiconductor have different thermal expansion coefficients. They are attached together at temperatures greater than room temperature, but cooled far below room temperature during actual operation. The thermal expansion mismatch induces stress in the infrared detector semiconductor which can cause failure in the field. Additionally, the infrared detector is attached to the silicon signal processing chip early in the fabrication sequence. Therefore the silicon chip must be present during the detector fabrication sequence with subsequent yield loss due to handling, chemical attack, electrical overstress, etc. Furthermore, most of the area of a completed vertically integrated MIS detector is taken up by the signal processing circuitry. The relatively small detector array is located in the middle of this circuitry. During fabrication, a single piece of detector semiconductor is mounted on the silicon signal processing substrate in order to cover as many detector array areas as possible. In spite of this method of maximizing the number of detector arrays from each piece of detector semiconductor, the absolute utilization of detector semiconductor is low. It is therefore desirable to eliminate or minimize each of the above noted problems encountered in the prior art.

SUMMARY OF THE INVENTION

In accordance with the present invention, the above noted problems of prior art infrared detectors are minimized. This is accomplished by utilizing a thin piece of insulating material with conducting paths therethrough. The infrared detector semiconductor is mounted onto the insulator and the detector array is then fabricated using the standard fabrication sequence for such an array. After the detector array has been fabricated on the insulator, the detector/insulator assembly is attached to the silicon signal processing chip with appropriate interconnection being made at that time between the detector and the processing chip.

Briefly, the above is accomplished by providing an electrically insulating layer with vias extending therethrough onto which is secured a slice of group II-VI semiconductor material with an appropriate epoxy, such as Ablebond 642-1 or other appropriate adhesive as is well known and which is sufficiently strong during the thermal cycling processing step so as not to be disattached as the securing agent. The thermal stress normally between the detectors and the chip is substantially passed on to the securing agent. Such epoxy will have high purity, low out gas rate and good chemical resistance in the environment. The electrically insulating layer is chosen to have a coefficient of thermal expansion which tracks that of group II-VI material. Preferably the group II-VI material is a composition having the formula $Hg_xCd_{1-x}Te$, denoted hereinafter as HgCdTe, and the electrically insulating material is preferably germanium, though other materials, such as but not limited to ceramics, GaAs, sapphire and HgCdTe can be used. The group II-VI semiconductor material is then processed and patterned in the manner noted in the above cited patents to provide detector elements, optional transistors and vias isolating the detector elements and the optional transistors from each other in standard manner, these vias being aligned with the vias in the insulating layer. The processed and patterned array structure comprising the insulating layer and processed detector array is than secured to a silicon signal processing chip by an epoxy or other appropriate adhesive with the vias aligned with pads or the like on the chip. The signal processing chip is preferably preprocessed at this time and contains all required processing circuitry therein. Interconnects are then formed which extend from the exposed surface of the layer, which includes detector elements and transistors, through the vias, to pads or the like on the chip in standard manner as set forth in the above noted patents. Such interconnects can also extend from detector elements to the transistors. The result is a single unit comprising an infrared detector with the support for the detector array having a coefficient of thermal expansion which substantially tracks that of the array.

The advantages of this procedure and structure are that the insulator can be polished and made smoother to a much greater degree than can the silicon signal processing chip, thereby minimizing crystal defects induced in the infrared detector. Also, the insulator material can be chosen so that the thermal expansion coefficient thereof matches that of the infrared detector. Thus, little stress will be developed in the infrared detector semiconductor when the completed detector assembly is cooled for operation. In addition, the silicon signal processing chip is attached to the detector/insulator assembly at the end of the fabrication sequence. The silicon chip is therefore not subjected to the detector fabrication sequence and does not suffer the attendant yield loss. Furthermore, the conducting paths through the insulator can be arranged so that detector arrays can be placed next to each other, providing more efficient utilization of the IR detector semiconductor material. After the detector arrays are fabricated on the insulator, the arrays can be individually separated using standard semiconductor processing methods, such as sawing, laser scribing, etc.

DESCRIPTION OF THE PREFERRED EMBODIMENT

Figure 1:
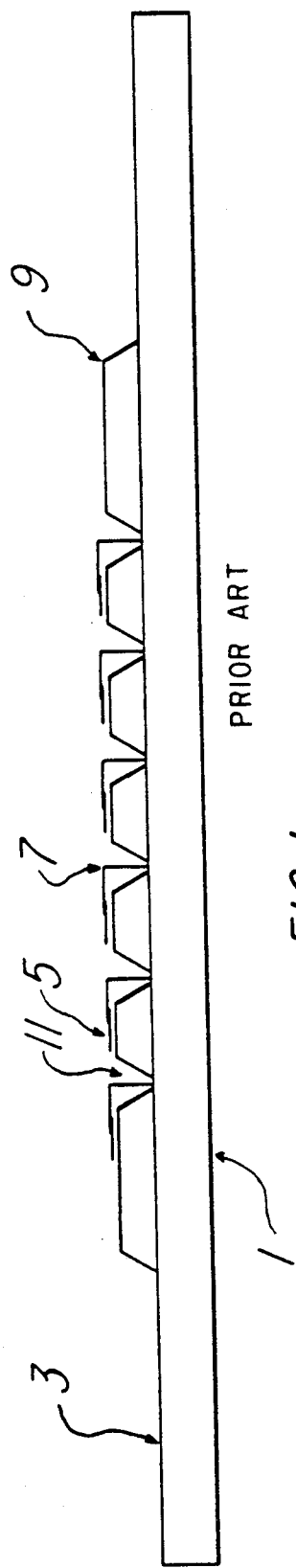
FIG. 1 is a schematic cross-sectional view of an infrared detector in accordance with the prior art.

Referring first to FIG. 1, there is shown an infrared detector 1 of the type disclosed in U.S. Pat. Nos. 4,447,291 and 4,720,738 which includes a silicon signal processing chip 3 and an infrared detector array that has been processed, the array including infrared detector elements 5 and optional infrared detector semiconductors 9, the array being secured directly to the chip 3 by an epoxy (not shown) such as Ablebond 642-1. Interconnects 7 extend from the exposed surfaces of the detector elements 5 through vias 11 which are located between the detector elements and formed during the processing of the detector array to pads or the like on the chip 3 to provide interconnection between the detector elements and the chip. In addition, interconnects (not shown) can extend from the infrared detector semiconductors 9 to detector elements 5 and/or to the chip through vias 11.

Figure 2A:
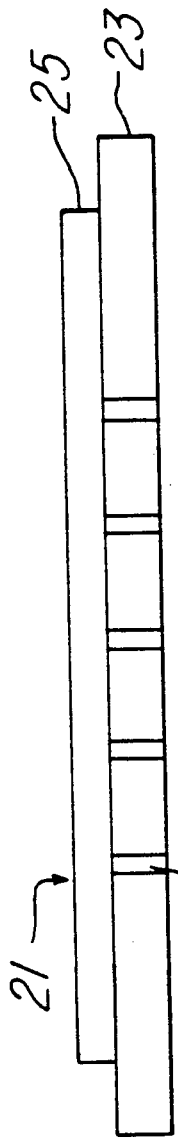
FIGS. 2(a) to 2(c) are schematic cross-sectional views of several stages of a partially fabricated infrared detector in accordance with the present invention.
Figure 2B:
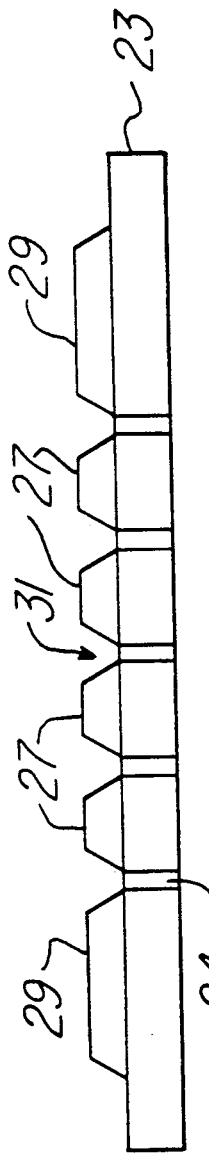

Referring now to FIG. 2(a) there is shown an array 21 being fabricated with a germanium electrically insulating layer 23 with vias 24 extending entirely therethrough onto which is secured a slice HgCdTe 25. An appropriate epoxy or other appropriate adhesive (not shown) as is well known is the securing agent. The electrically insulating layer is chosen to have a coefficient of thermal expansion which tracks that of the selected group II-VI material. The HgCdTe semiconductor material is then processed and patterned in the manner noted in the above cited patents to provide detector elements 27, optional transistors 29 and vias 31 isolating the detector elements and the optional transistors from each other in standard manner, these vias being aligned with the vias in the insulating layer as shown in FIG. 2(b).

Figure 3:
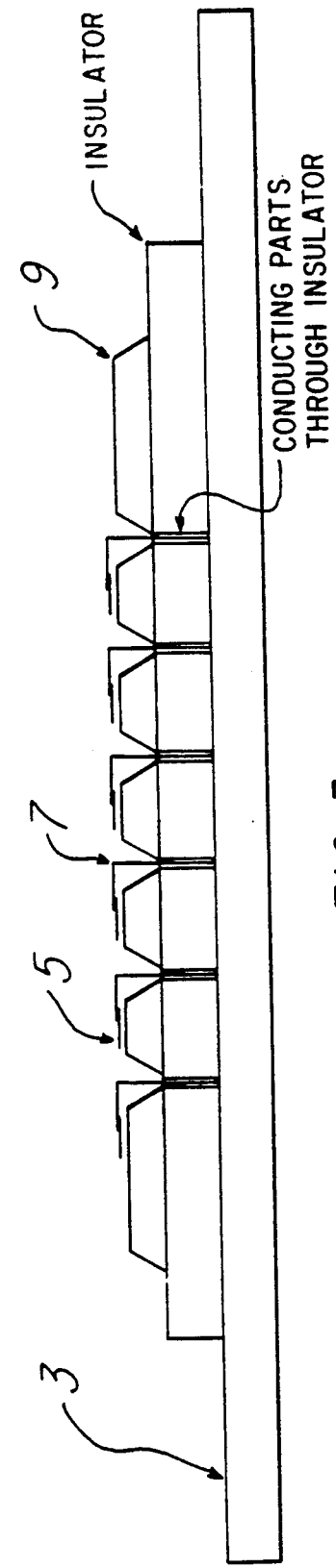
FIG. 3 is a schematic cross-sectional view of a completed infrared detector in accordance with the present invention.
Figure 2C:
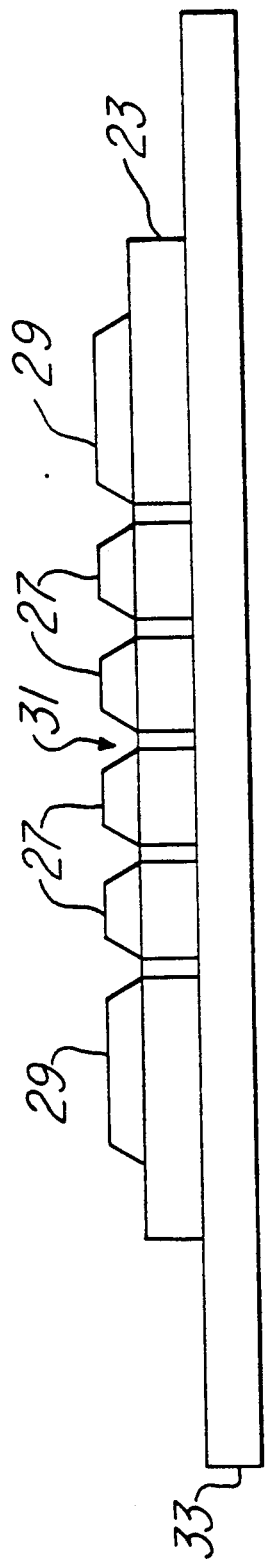

The processed and patterned array structure comprising the insulating layer 23 and processed detector array 27, 29 is then secured to a silicon signal processing chip 33 by an epoxy, such as Ablebond 642-1 or other appropriate adhesive (not shown) which is sufficiently strong so as not to become disattached during the thermal processing fabrication steps. The thermal stress between the chip 33 and the detector elements of the prior art is accordingly passed to the adhesive (not shown) instead. The vias 31 are aligned with pads or the like (not shown) on the chip 33 as shown in FIG. 2(c). The signal processing chip 33 is preferably preprocessed at this time and contains all required processing circuitry therein. Interconnects 35 are then formed which extend from the exposed surface of the layer 25, which includes detector elements 27 and transistors 29, through the vias 31 and 24, to pads or the like on the chip 33. Such interconnects can also extend from detector elements 27 to the transistors 29. The result is a single unit comprising an infrared detector with the support for the detector array having a coefficient of thermal expansion which substantially tracks that of the array as shown in FIG. 3.

Though the invention has been described with respect to a specific preferred embodiment thereof, many variations and modifications will immediately become apparent to those skilled in the art. It is therefore the intention that the appended claims be interpreted as broadly as possible in view of the prior art to include all such variations and modifications.

We claim:

1. An infrared detector which comprises:
   (a) a semiconductor chip having a surface with electrical circuitry disposed thereat;
   (b) an electrically insulating layer having a pair of opposing surfaces, one of said opposing surfaces secured to said surface of said chip with electrical circuitry disposed thereat, said electrically insulating layer having vias extending therethrough to predetermined locations on said chip;
   (c) a layer of group II-VI semiconductor material secured to the other of said opposing surfaces of said insulating layer, said layer of group II-VI semiconductor material having infrared detector elements disposed thereat and vias communicating with said vias extending through said insulating layer; and
   (d) interconnects extending through said vias in said layer of group II-VI semiconductor material and said vias extending through said insulating layer coupling said detector elements to said predetermined locations on said chip;
   (e) wherein the coefficient of thermal expansion of said electrically insulating layer substantially tracks the coefficient of thermal expansion of said layer of group II-VI semiconductor material.

2. An infrared detector which comprises:
   (a) a semiconductor chip having a surface with electrical circuitry disposed thereat;
   (b) an electrically insulating layer having a pair of opposing surfaces, one of said opposing surfaces secured to said surface of said chip with electrical circuitry disposed thereat, said electrically insulating layer having vias extending therethrough to predetermined locations on said chip;
   (c) a layer of group II-VI semiconductor material secured to the other of said opposing surfaces of said insulating layer, said layer of group II-VI semiconductor material having infrared detector elements disposed thereat and vias communicating with said vias extending through said insulating layer; and
   (d) interconnects extending through said vias in said layer of group II-VI semiconductor material and said vias extending through said insulating layer coupling said detector elements to said predetermined locations on said chip;
   (e) wherein said chip is a silicon signal processing chip;
   (f) wherein the coefficient of thermal expansion of said electrically insulating layer substantially tracks the coefficient of thermal expansion of said layer of group II-VI semiconductor material.

3. An infrared detector which comprises:
   (a) a semiconductor chip having a surface with electrical circuitry disposed thereat;
   (b) an electrically insulating layer having a pair of opposing surfaces, one of said opposing surfaces secured to said surface of said chip with electrical circuitry disposed thereat, said electrically insulating layer having vias extending therethrough to predetermined locations on said chip;

(c) a layer of group II-VI semiconductor material secured to the other of said opposing surfaces of said insulating layer, said layer of group II-VI semiconductor material having infrared detector elements disposed thereat and vias communicating with said vias extending through said insulating layer; and (d) interconnects extending through said vias in said layer of group II-VI semiconductor material and said vias extending through said insulating layer coupling said detector elements to said predetermined locations on said chip;

(e) wherein said insulative layer is germanium.

4. A detector as set forth in claim 1 wherein said electrically insulating layer is germanium.

5. A detector as set forth in claim 2 wherein said electrically insulating layer is germanium.

6. An infrared detector which comprises:

(a) a semiconductor chip having a surface with electrical circuitry disposed thereat;

(b) an electrically insulating layer having a pair of opposing surfaces, one of said opposing surfaces secured to said surface of said chip with electrical circuitry disposed thereat, said electrically insulating layer having vias extending therethrough to predetermined locations on said chip;

(c) a layer of group II-VI semiconductor material secured to the other of said opposing surfaces of said insulating layer, said layer of group II-VI semiconductor material having infrared detector elements disposed thereat and vias communicating with said vias extending through said insulating layer; and (d) interconnects extending through said vias in said layer of group II-VI semiconductor material and said vias extending through said insulating layer coupling said detector elements to said predetermined locations on said chip;

(e) wherein said chip is a silicon signal processing chip;

(f) wherein said group II-VI semiconductor material is HgCdTe and said insulating layer is germanium.

7. A detector as set forth in claim 1 wherein said group II-VI semiconductor material is HgCdTe.

8. A detector as set forth in claim 2 wherein said group II-VI semiconductor material is HgCdTe.

9. A detector as set forth in claim 3 wherein said group II-VI semiconductor material is HgCdTe.

10. A detector as set forth in claim 4 wherein said group II-VI semiconductor material is HgCdTe.

11. A detector as set forth in claim 5 wherein said group II-VI semiconductor material is HgCdTe.

12. A method of fabricating an infrared detector, comprising the steps of:

(a) providing a semiconductor layer of group II-VI material;

(b) providing an electrically insulating layer having a pair of opposing surfaces and having vias therethrough at predetermined locations and having a coefficient of thermal expansion which substantially tracks the coefficient of thermal expansion of said semiconductor layer;

(c) securing said semiconductor layer of group II-VI material to one of said opposing surfaces of said insulating layer;

(d) forming infrared detector elements on said semiconductor layer;

(e) forming vias through said semiconductor layer of group II-VI material aligned with said vias through said insulating layer;

(f) providing a signal processing semiconductor chip;

(g) securing the other of said opposing surfaces of said insulating layer to said surface of said signal processing semiconductor chip; and (h) forming electrical interconnects between said detector elements and said chip through said vias.

13. The method of claim 12 wherein said group II-VI semiconductor material is HgCdTe.

14. The method of claim 12 wherein said insulating layer is germanium.

15. The method of claim 13 wherein said insulating layer is germanium.

16. A method as set forth in claim 12, further including providing an attaching agent securing said chip to said insulating layer, said attaching agent being sufficiently strong to retain said attachment during thermal cycling during processing and receiving thermally caused stresses between said chip and said detector elements.

* * * * *